United States Patent
Opsomer et al.

(10) Patent No.: US 9,609,776 B2
(45) Date of Patent: Mar. 28, 2017

(54) VISUAL DISPLAY DEVICE

(71) Applicant: TAIT TECHNOLOGIES BVBA, Waardamme (BE)

(72) Inventors: Frederic Frank Opsomer, Kortemark (BE); Adam Davis, Leola, PA (US)

(73) Assignee: Tait Towers Manufacturing, LLC, Lititz, PA (US)

( * ) Notice: Subject to any disclaimer, the term of this patent is extended or adjusted under 35 U.S.C. 154(b) by 294 days.

(21) Appl. No.: 13/767,428

(22) Filed: Feb. 14, 2013

(65) Prior Publication Data

US 2014/0168983 A1 Jun. 19, 2014

(30) Foreign Application Priority Data

Dec. 18, 2012 (BE) .................................... 2012/0846
Dec. 18, 2012 (EP) .............................. 1355036-0001
Dec. 18, 2012 (EP) .............................. 1355036-0002

(51) Int. Cl.

| | |
|---|---|
| G09F 19/02 | (2006.01) |
| H05K 7/02 | (2006.01) |
| F21V 21/00 | (2006.01) |
| H05K 13/00 | (2006.01) |
| G09F 9/302 | (2006.01) |
| G09F 9/37 | (2006.01) |
| G09F 11/02 | (2006.01) |
| G09F 11/23 | (2006.01) |
| G09F 13/32 | (2006.01) |
| G09F 13/36 | (2006.01) |

(52) U.S. Cl.
CPC ............ *H05K 7/026* (2013.01); *F21V 21/00* (2013.01); *G09F 9/3026* (2013.01); *G09F 9/372* (2013.01); *G09F 11/02* (2013.01); *G09F 11/23* (2013.01); *G09F 13/32* (2013.01); *G09F 13/36* (2013.01); *G09F 19/02* (2013.01); *H05K 13/0015* (2013.01); *Y10T 29/49* (2015.01)

(58) Field of Classification Search
CPC .......... G09F 11/23; G09F 13/04; G09F 19/02; G09F 9/3026; G09F 9/372; G09F 11/02; G09F 13/32; G09F 13/36; H05K 7/026; H05K 13/0015; F21V 21/00
USPC .......... 362/559, 602, 604, 812; 40/470, 502, 40/541, 564
See application file for complete search history.

(56) References Cited

U.S. PATENT DOCUMENTS

| | | | |
|---|---|---|---|
| 4,381,616 A | 5/1983 | Saxer | |
| 6,561,250 B2 * | 5/2003 | Hutchins | ..................... 160/89 |
| 6,662,482 B2 * | 12/2003 | Segan et al. | ..................... 40/503 |
| 6,695,270 B1 * | 2/2004 | Smed | ............... F16M 11/04 248/274.1 |

(Continued)

FOREIGN PATENT DOCUMENTS

| | | |
|---|---|---|
| GB | 2405595 A1 | 9/2005 |
| WO | 9307607 A1 | 4/1993 |

(Continued)

*Primary Examiner* — Peggy Neils
(74) *Attorney, Agent, or Firm* — McNees Wallace & Nurick LLC

(57) ABSTRACT

A visual display includes a plurality of display panels. Each of the display panels is secured to a common support device and independently movable relative to an axis associated with the common support device. The display panels are positionable in a first position.

21 Claims, 12 Drawing Sheets

(56) References Cited

U.S. PATENT DOCUMENTS

| | | | |
|---|---|---|---|
| 7,175,152 B2* | 2/2007 | Dittmer | F16M 11/04 |
| | | | 248/221.11 |
| 8,405,704 B2* | 3/2013 | Kobayashi | H04N 7/142 |
| | | | 348/14.07 |
| 2004/0261303 A1* | 12/2004 | White et al. | 40/601 |
| 2005/0201087 A1* | 9/2005 | Ward | 362/223 |
| 2008/0236045 A1 | 10/2008 | DeBlonk et al. | |
| 2010/0107461 A1* | 5/2010 | Carter | 40/514 |
| 2011/0157893 A1* | 6/2011 | Ngai et al. | 362/249.02 |
| 2012/0198739 A1* | 8/2012 | Venetucci et al. | 40/470 |
| 2012/0224311 A1* | 9/2012 | Sutherland et al. | 361/679.01 |
| 2012/0257397 A1* | 10/2012 | Lee et al. | 362/374 |

FOREIGN PATENT DOCUMENTS

| | | | |
|---|---|---|---|
| WO | WO 99/03088 | * | 1/1999 |
| WO | 2011050475 A1 | | 5/2011 |

* cited by examiner

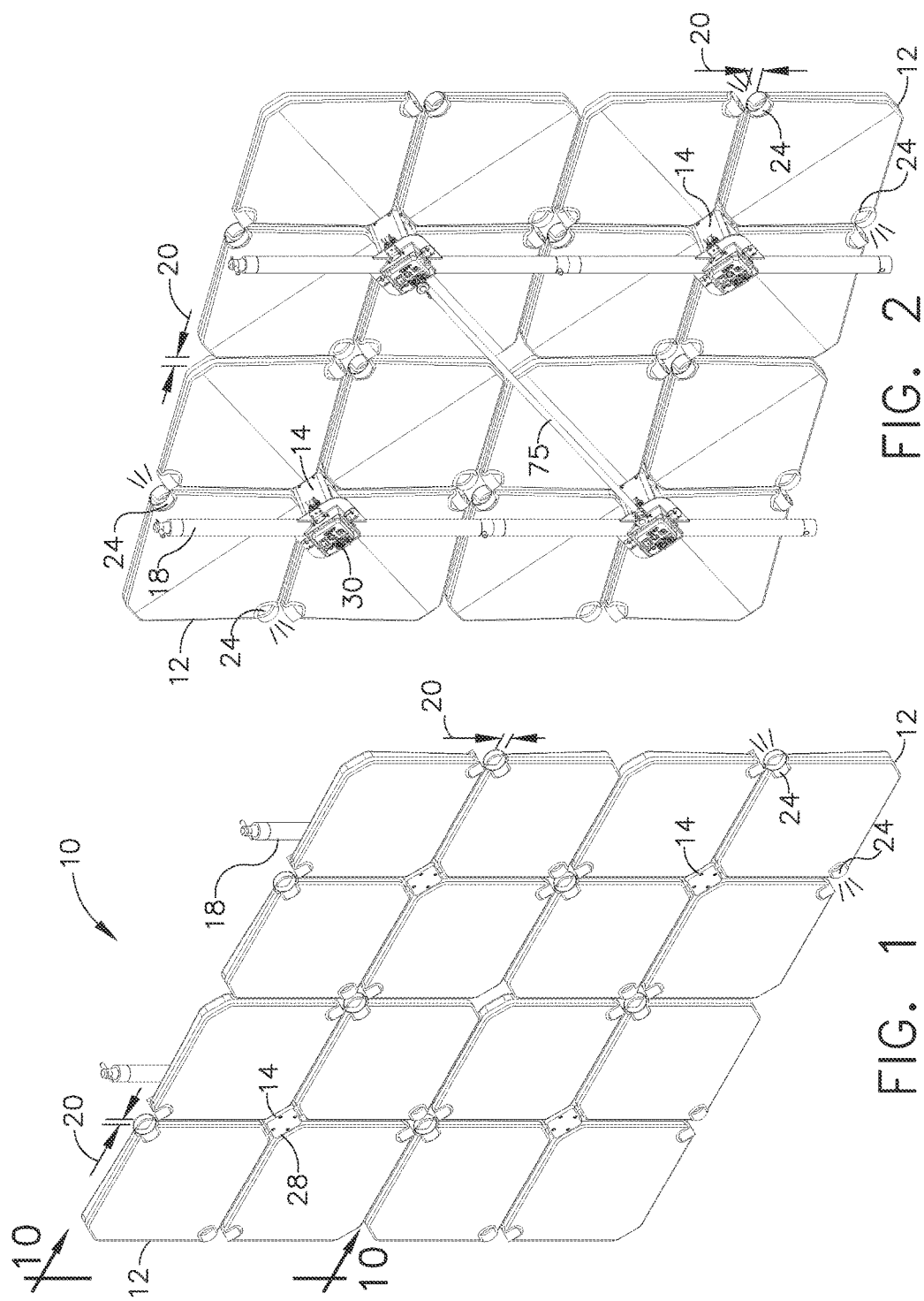

VISUAL DISPLAY DEVICE

FIELD OF THE DISCLOSURE

The present disclosure relates to visual display devices and structures for supporting the same. More specifically, the present disclosure relates to visual display devices having moving display panels relative to the supporting structures and a method for making the same.

BACKGROUND OF THE DISCLOSURE

Display systems, such as conventional video display systems used in venues for public performance utilize display panels that are fixedly attached to support structure. Typically, these display systems are limited to two dimensions, and are immobile during the performance.

Motion has been incorporated into art forms such as man-made water fountains, providing a dynamic and pleasing authentic three dimensional visual experience. However, to date, display systems, such as those composed of flat screens have not incorporated such authentic three dimensional movement.

Therefore, there is an unmet need to provide visual displays incorporating relative movement between adjacent display panels as an integral part of a public performance. Such relative movement between adjacent panels either alone or in combination with specially configured lighting effects, can provide an intriguing, highly entertaining visual experience.

SUMMARY OF THE DISCLOSURE

One aspect of the disclosure refers to a visual display device includes a plurality of display panels. Each of the display panels is secured to a common support device and independently movable relative to an axis associated with the common support device, the display panels positionable in a first position.

Another aspect of the disclosure refers to a visual display panel including a body securable to a support device along an axis of the support device. The body is movable relative to the axis. The body has a first portion and a second portion including selectively separable, reusable, self-aligning mating features.

Another aspect of the disclosure refers to a method for forming a visual effect. The method includes providing a plurality of display panels, each of the display panels is secured to a common support device and independently movable relative to an axis associated with the common support device. The display panels are positionable in a first position. The method further includes manipulating at least one of the panels between the first position and a second position.

A further aspect of the disclosure refers to a visual display including a plurality of visual display devices to form the visual display. The visual display devices each including a plurality of display panels, each of the display panels is secured to a common support device and independently movable relative to an axis associated with the common support device, the display panels positionable in a first position.

An advantage of the present disclosure is that the visual display device provides an authentic three dimensional visual experience, due to movement of display panels relative to one another.

Another advantage of the present disclosure is that the visual display device provides coordinated lighting effects in combination with the movement of display panels, providing a pleasing visual experience.

Yet another advantage of the present disclosure is that the visual display may be used in multiple media or surrounding environments, including one or more of air, water, fog and sound in combination with coordinated lighting effects to provide a pleasing audio/visual experience.

Yet another advantage of the present disclosure is that the structures for supporting the visual display can be configured to be substantially invisible.

Further aspects of the method and system are disclosed herein. The features as discussed above, as well as other features and advantages of the present disclosure will be appreciated and understood by those skilled in the art from the following detailed description and drawings.

BRIEF DESCRIPTION OF THE DRAWINGS

FIG. 1 shows a perspective view of an exemplary embodiment of a visual display.

FIG. 2 shows a reverse perspective view of an exemplary embodiment of the visual display of FIG. 1.

Wherever possible, the same reference numbers will be used throughout the drawings to represent the same parts.

DESCRIPTION OF THE DISCLOSURE

Figure 4:
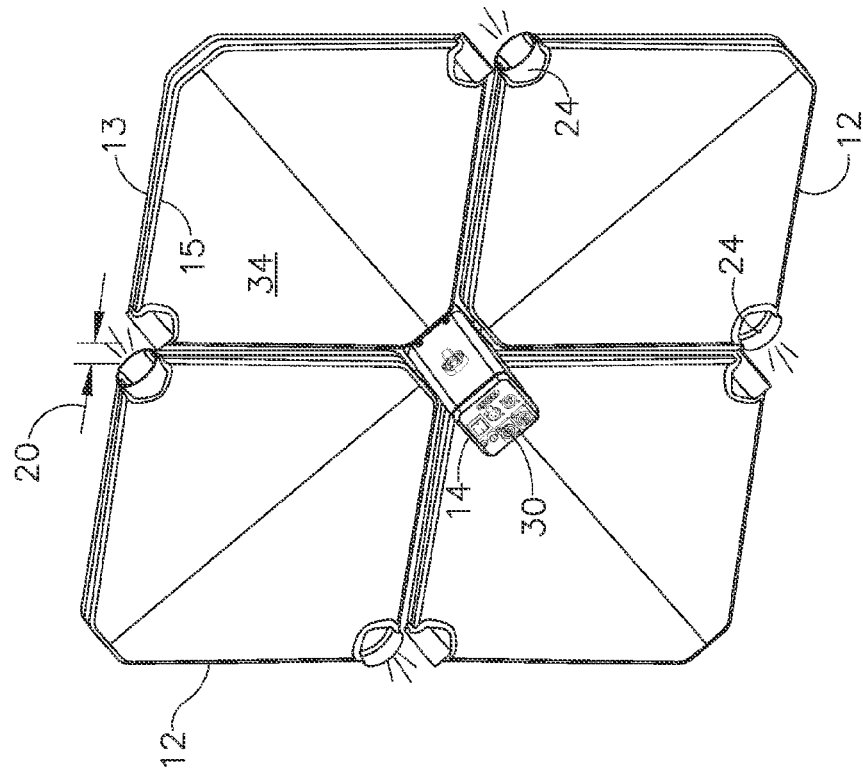
FIG. 4 shows a reverse perspective view of an exemplary embodiment of the visual display device of FIG. 3.

FIGS. 1 and 2 show opposed or reversed perspective views of a visual display 10 supported by structure 18. As further shown in FIGS. 3 and 4, visual display device 11 includes a plurality of display panels 12 secured to a common support device 14. As will be discussed in further detail below, in addition to being secured to the common support device 14, the plurality of display panels 12 are also independently movable relative to a corresponding panel axis 22 (e.g., FIGS. 3 and 5) of support device 14. The independent movement of display panels 12, including relative movement between adjacent display panels 12 of visual display device 11 can, by itself, form an integral part of a public performance. As will also be discussed in further detail below, such relative movement between display panels 12 either alone or in combination with specially configured visual effects, including illumination such as from illumination opening(s) 24 of one or more of display panels 12, other illumination effects associated with the surfaces of the display panels 12, external lighting sources, their combination, as well as interaction with a medium or surrounding environment associated with the visual display can provide an intriguing, highly entertaining visual experience associated with a performance.

Figure 3:
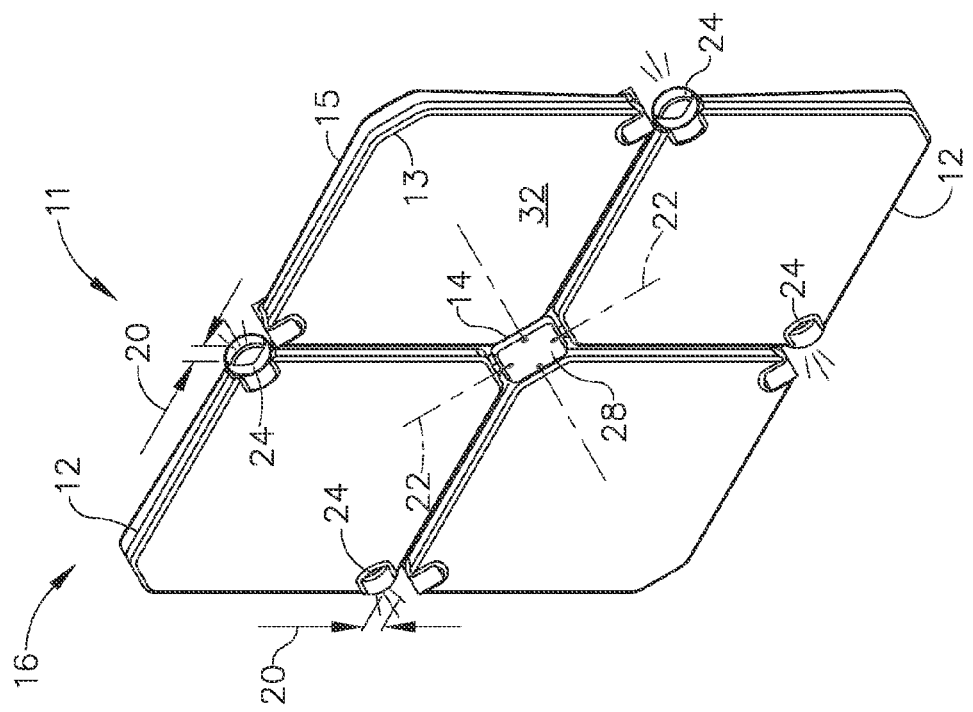
FIG. 3 shows an enlarged perspective view of an exemplary embodiment of a visual display device.
Figure 17:
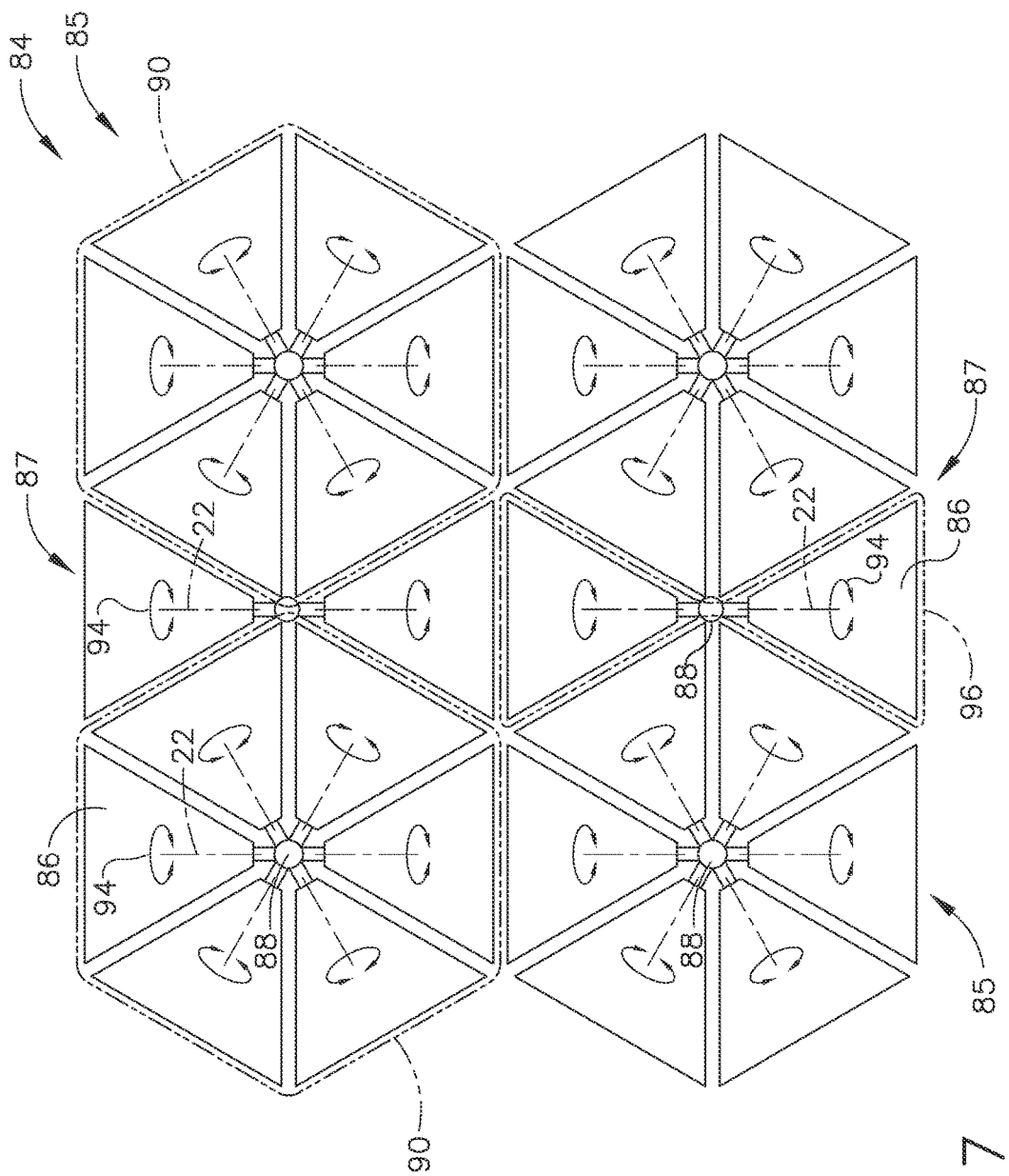
FIG. 17 shows a front view of the exemplary embodiment of a visual display.

As further shown in FIGS. 3 and 4, an exemplary grouping or plurality of display panels 12, such as four display panels associated with a common support device 14 is now discussed. In one embodiment, such as shown in FIG. 17, a visual display 84 can include visual device(s) 85 containing more than four display panels 86, such as a plurality 90 of display panels that can be associated with a common support device 88. As further shown in FIG. 17, visual display 84 can include visual display device(s) 87 containing less than four display panels, such as a plurality 96 of display panels 86 which can be associated with common support device 88. As further shown in FIG. 17, a visual display, such as visual display 84 can contain a combination of different numbers of display panels that can be associated with a corresponding common support device. As yet further shown in FIGS. 3 and 4, display panels 12 include a pair of opposed illumination openings 24 for selectively providing illumination exterior of the display panels 12 by an illumination source 26 (FIG. 9) positioned inside or interior of the display panels 12. In one embodiment, at least one illumination source is movable relative to the display panel, such as by moving device 41 (FIG. 9).

It is to be understood that an illumination source can include one or more light emitting diodes (LEDs). In another embodiment, the illumination sources may include but are not limited to other light sources, for example organic light emitting diodes (OLEDs), incandescent bulbs, fluorescent bulbs, polymer light emitting diodes, electroluminescent lights, other suitable illuminating or light emitting sources. Such illumination sources can include different colors and intensities. In one embodiment, the illumination sources can change colors and intensities by themselves or in combination with movement of the display panels. In one embodiment, the exterior illumination sources are movable. In one embodiment, the display panels can include zero illumination openings. In another embodiment, the display panels can include one illumination opening. In yet another embodiment, the display panels can include more than two illumination openings. In one embodiment, the illumination openings may be positioned anywhere on the display panels, i.e., are not limited to corners or edges of the display panels. In one embodiment, the illumination opening(s) can be sized differently relative to one another. In one embodiment, the illumination opening(s) of display panels can be configured differently from each other.

As further shown in FIGS. 3 and 4, in an assembled condition, an end 28 of support device 14 is positioned in close proximity or proximal to display panels 12, with end 30 positioned distally from display panels 12. As further shown collectively in FIGS. 3 and 4, display panels 12 of visual display device 11 are positionable in a first position 16, in which, for example, adjacent display panels 12 are separated by a spacing 20, such that display panels 12 provide an appearance of a substantially continuous surface relative to an adjacent display panel 12. In one embodiment, the spacing between adjacent display panels corresponding to a common support device can be different, and in another embodiment, the spacing between groupings of display panels corresponding to different support devices, such as for a visual display can be different. In one embodiment, the substantially continuous surface is substantially planar, while in other embodiments, at least one of the surfaces of the display panels 12 can be non-planar. In one embodiment, display panels 12 are substantially similar in size, shape and texture (e.g., visual behavior associated with the exterior surface of display panels) while in another embodiment, one or more display panels 12 may be shaped, sized and/or textured differently, according to the visual effect desired.

Figure 9:
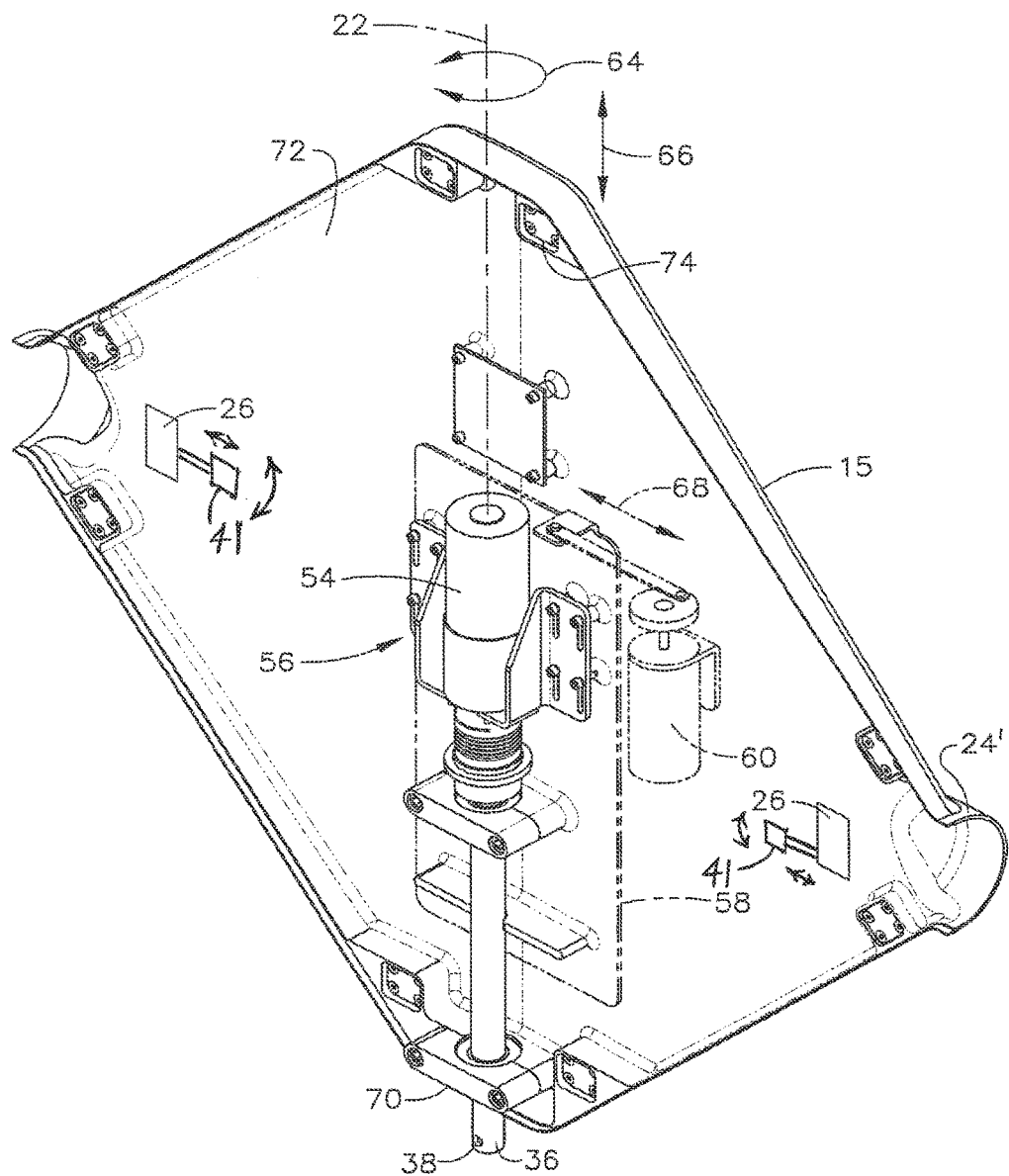
FIG. 9 shows a partial cutaway view of an exemplary embodiment of a display panel.

It is to be understood that movement 94 of display panels 86 relative to panel axis 22 in FIG. 17 corresponds to movement of one or more degrees of freedom relative to panel axis 22, including but not limited to rotational movement about panel axis 22, axial movement parallel to panel axis 22 as well as a pivoting movement relative to panel axis 22 as will be discussed in additional detail in another embodiment, in a similar manner as shown in FIG. 9.

Figure 14:
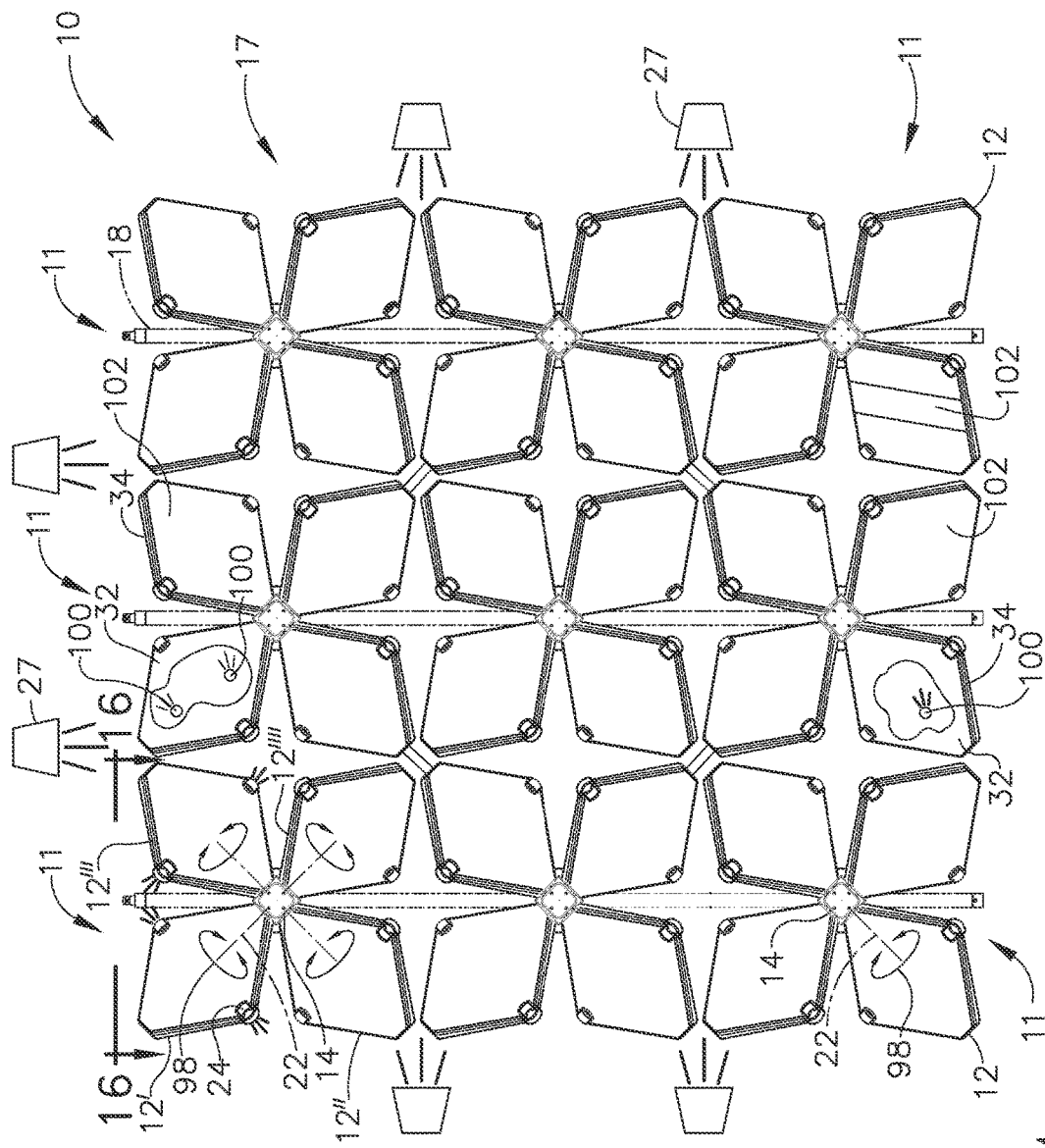
FIG. 14 shows a front view of exemplary embodiment of a visual display.

It is to be understood that the term "a plurality of display panels" not only refers to display panels secured to a common support device, but includes a collection or compilation of display panels and their corresponding common support devices, such as shown in the FIGS. 1 and 14.

As shown collectively in FIGS. 3-12, display panel 12 includes a pair of opposed display panel portions 13, 15 having corresponding exterior surfaces 32, 34. As further shown collectively in FIGS. 8-9, display panel portion 15 includes a bend 19 formed therein, resulting in a faceted exterior surface 34, as well as an illumination opening portion 24' associated with one or more illumination sources 26 as previously discussed. Display panel portion 15 further includes a motor 54 secured inside of display panel 12 by motor mounting hardware 56, including but not limited to a bracket, bearing holder, and fasteners. As further shown in FIG. 9, motor 54 is secured to a shaft 36 including a panel axis 22 and having an aperture 38 positioned near an end of shaft 36 opposite motor 54. Shaft 36 of motor 54 is configured to be received in an opening 40 of support device 14 in close proximity to end 28 of support device 14. An aperture 42, such as a threaded aperture is configured to receive a fastener (not shown) such as a threaded fastener that extends through a corresponding opening 40 of support device 14 and an aligned aperture 38 of shaft 36 that has been inserted inside of opening 40. As further shown in FIGS. 5 and 6, openings 40 have a panel axis 22.

Figure 5:
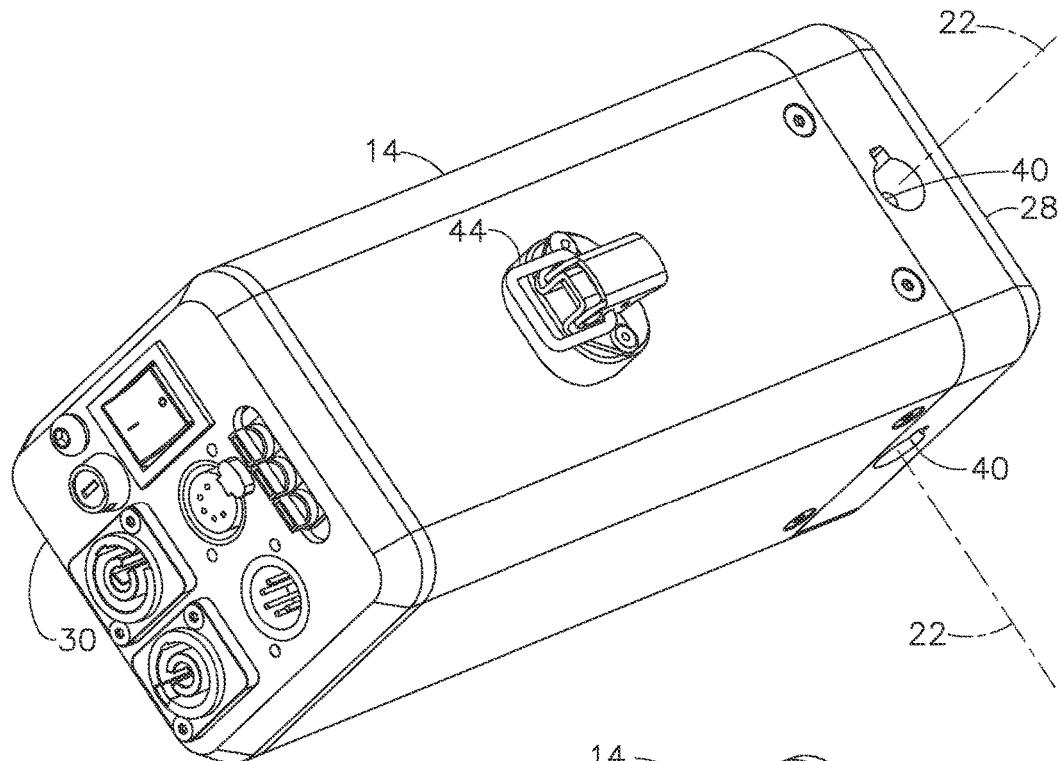
FIG. 5 shows a perspective view of an exemplary embodiment of a support device.
Figure 6:
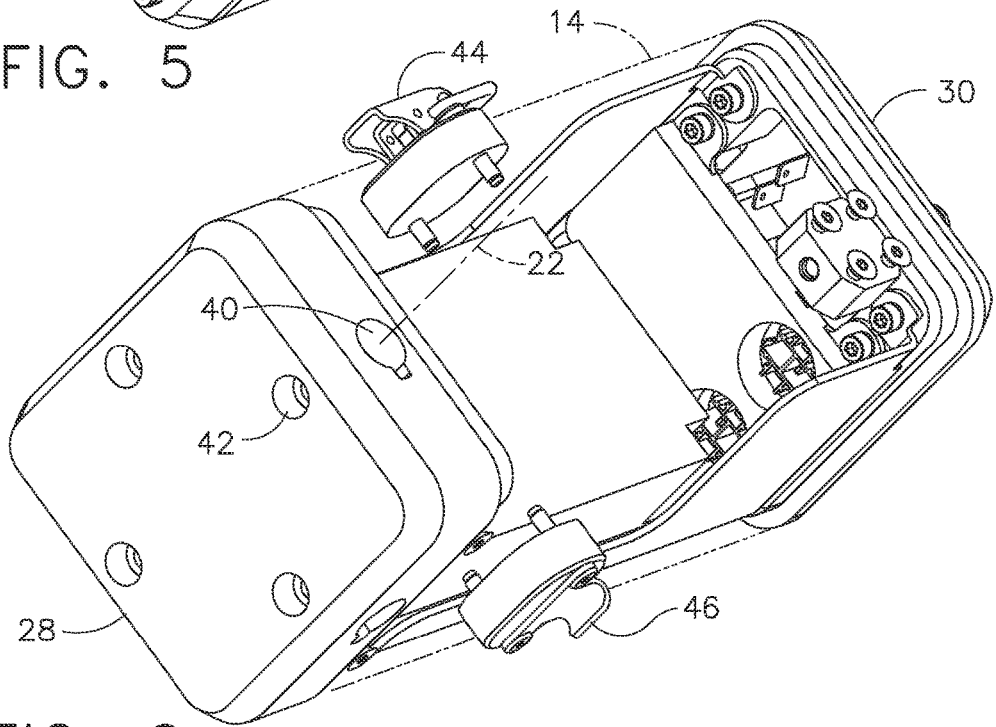
FIG. 6 shows a reverse perspective view of an exemplary embodiment of the support device of FIG. 5.
Figure 7:
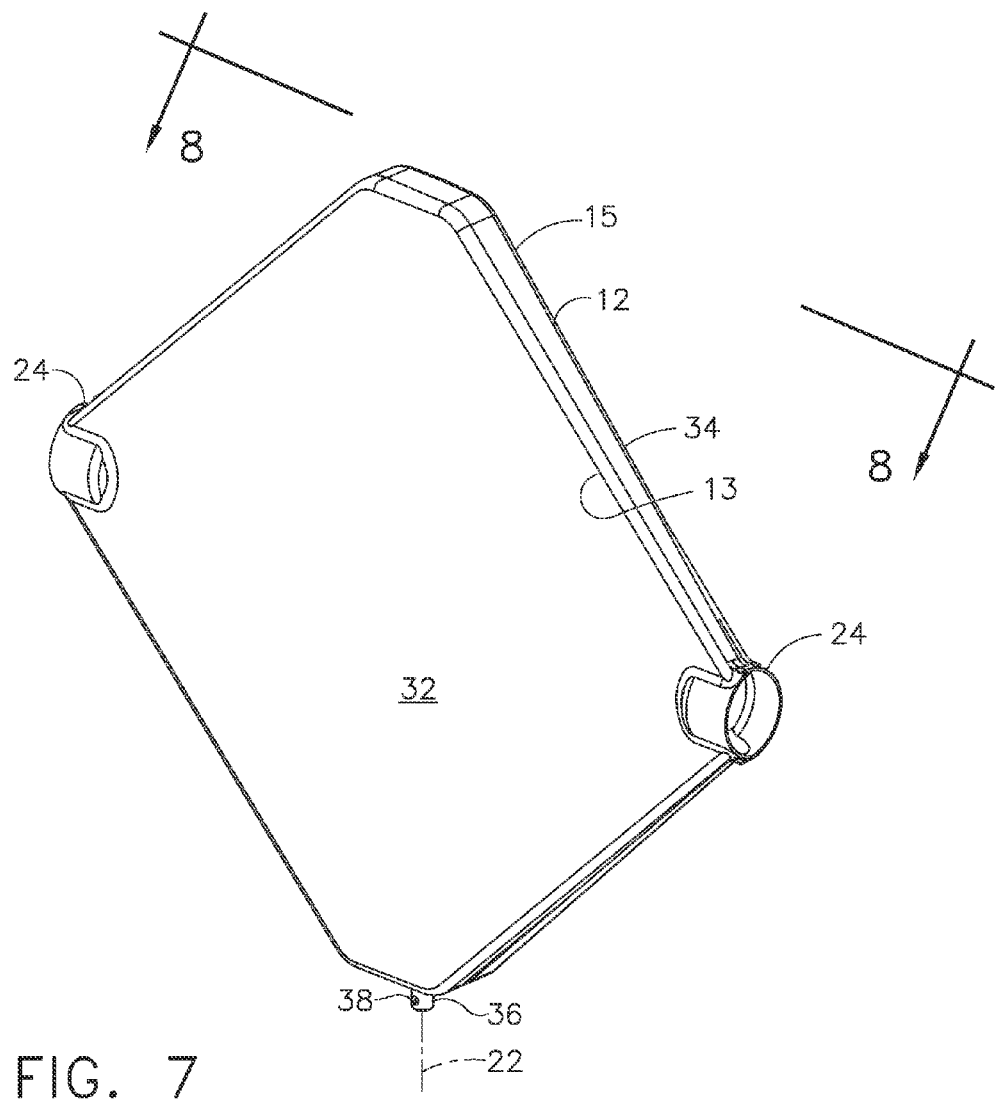
FIG. 7 shows a perspective view of an exemplary embodiment of a display panel.
Figure 8:
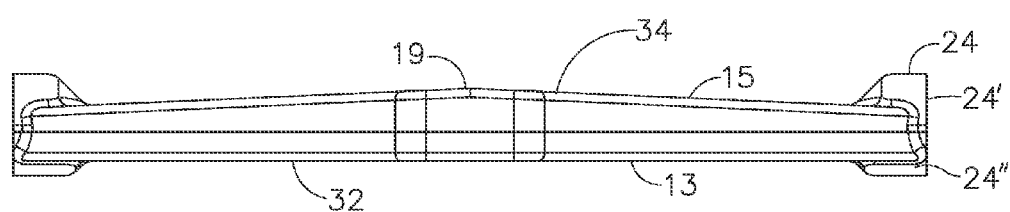
FIG. 8 shows a view taken along line 8-8 from FIG. 7 of an exemplary embodiment of a display panel.

Upon assembly of shaft 36 to support device 14, shaft 36 and opening 40 are aligned with panel axis 22. As shown in FIG. 5, opening 40 includes a slot or keyway that provides an insertion orientation of shaft 36 relative to opening 40. That is, shaft 36 may include a protruding portion (not shown) such as a pin or a machined protruding feature formed in shaft 36 such that the protruding portion of shaft 36 must be aligned with the slot or keyway of opening 40 to permit insertion of shaft 36 in opening 40. Such alignment features ensure proper orientation of the display panels relative to the support device. Further, by virtue of assembly of shaft 36 inside of opening 40, there is essentially no relative movement of shaft 36 relative to support device 14. In other words, if motor 54 urges shaft 36 into rotational movement 64 about panel axis 22 in one direction relative to display device 12, by virtue of the nonmoving connection between shaft 36 relative to support device 14 (with support device 14 remaining in a fixed reference position), the resulting movement relative to support device 14 is rotational movement of display panel 12 about panel axis 22 in an opposite direction.

As further shown in FIG. 9, an optional additional degree of freedom of movement of display panel 12 relative to support device 14 is now discussed. That is, if motor mounting hardware 56 is affixed to a movable surface 58 interior of panel portion 15 which is slidably movable relative to an inside base surface 72 of display panel portion 15, a motor 60 affixed to inside base surface 72 and further engaged with movable surface 58 can urge relative movement such as a pivoting movement 68 of movable surface 58 relative to inside base surface 72 of display panel portion 15. For example, upon actuation of motor 60 in one direction, movable surface 58 can be urged into relative movement such as a pivoting movement 68 about bearing holder 70. As further shown in FIG. 9, motor 60 could utilize a linkage to provide an oscillating pivoting movement 68 about bearing holder 70. In one embodiment, motor 60 could urge movable surface 58 to provide pivoting movement 68 about bearing holder 70 using a rack and pinion arrangement, or other suitable apparatus or construction. As a result, in response to selective enablement, actuation or the like of one or more of motors 54, 64, display panel 12 is movable in up to three degrees of freedom relative to panel axis 22 of opening 40 of support device 14. A controller (not shown) for controlling movement of the display panels 12 of the visual display may be contained inside of one or more of the respective support device(s) 14 or exterior of and remotely positioned relative to the support device(s) 14. In one embodiment, more than three degrees of freedom can exist between the support device and the display panel.

It is to be understood that each of the motors controlling movement of the display panels relative to the corresponding support device can be selectably or independently actuated relative to one another to achieve the desired visual effect as well as preventing the display panels from colliding with one another during operation, such as when display panels are urged into sufficient axial movement about and/or pivoting movement relative to corresponding axes or support devices.

Figure 10:
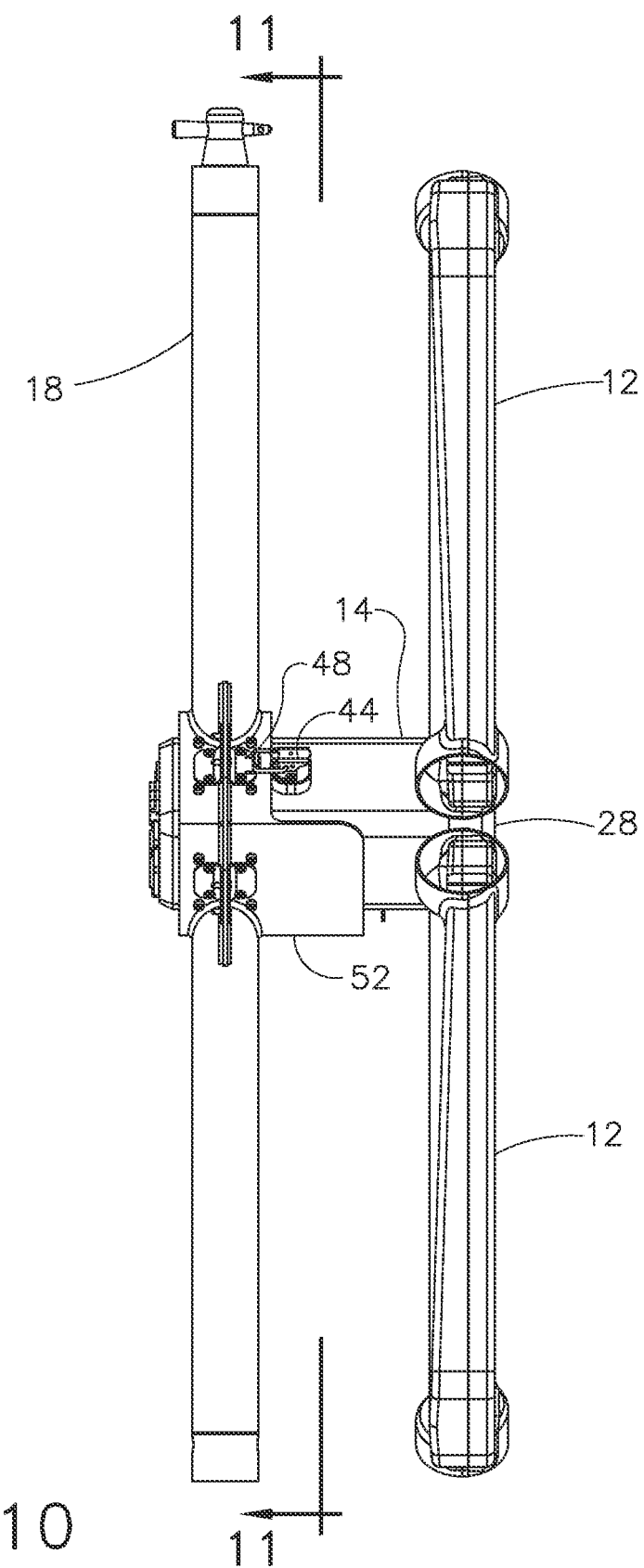
FIG. 10 shows a view taken along line 10-10 from FIG. 1 of a visual display device.
Figures 11, 12:
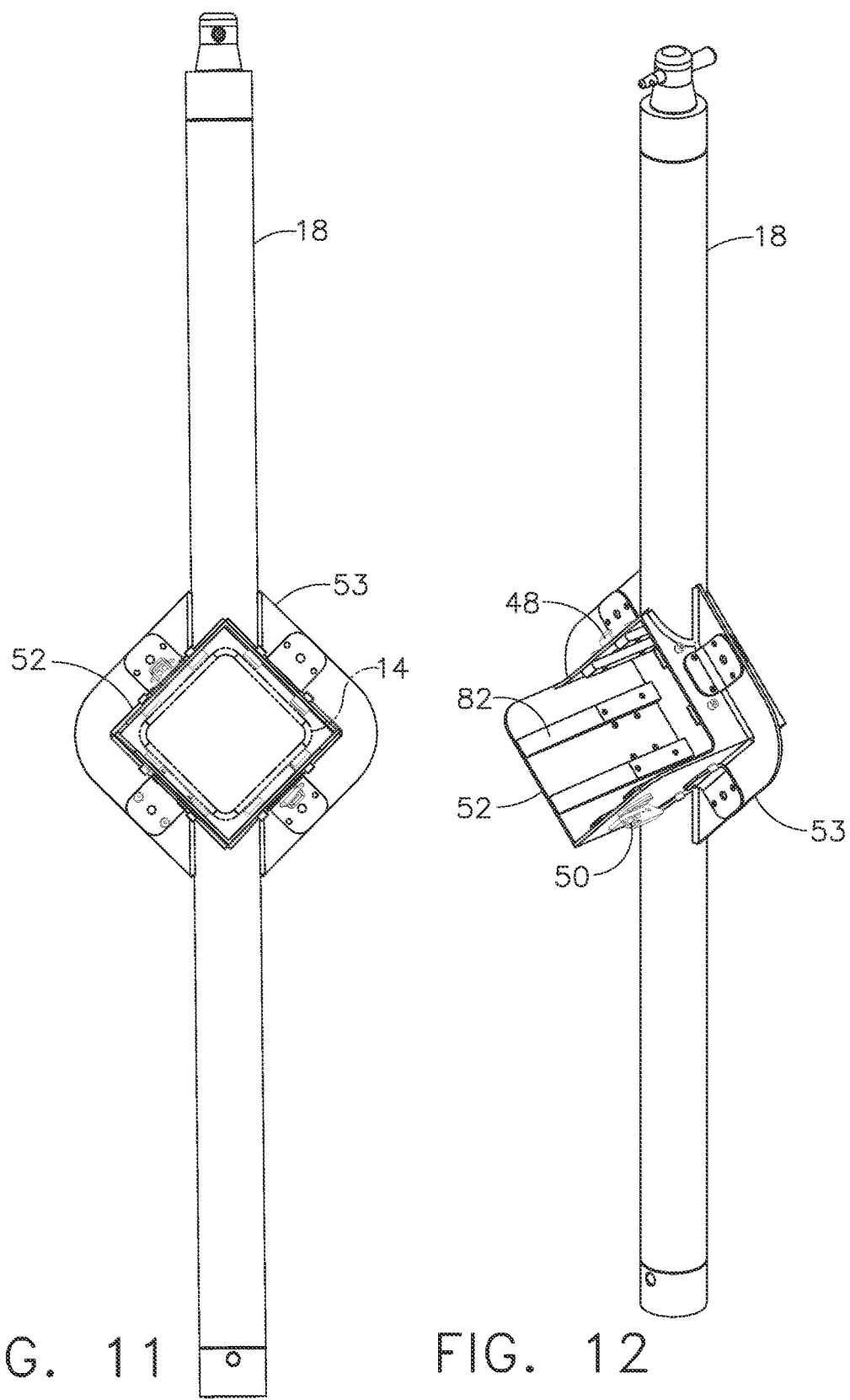
FIG. 11 shows a view taken along line 11-11 from FIG. 10 of an exemplary embodiment of a support for a visual display device.
FIG. 12 shows an enlarged perspective view of the exemplary embodiment of a support of FIG. 11.
Figure 13:
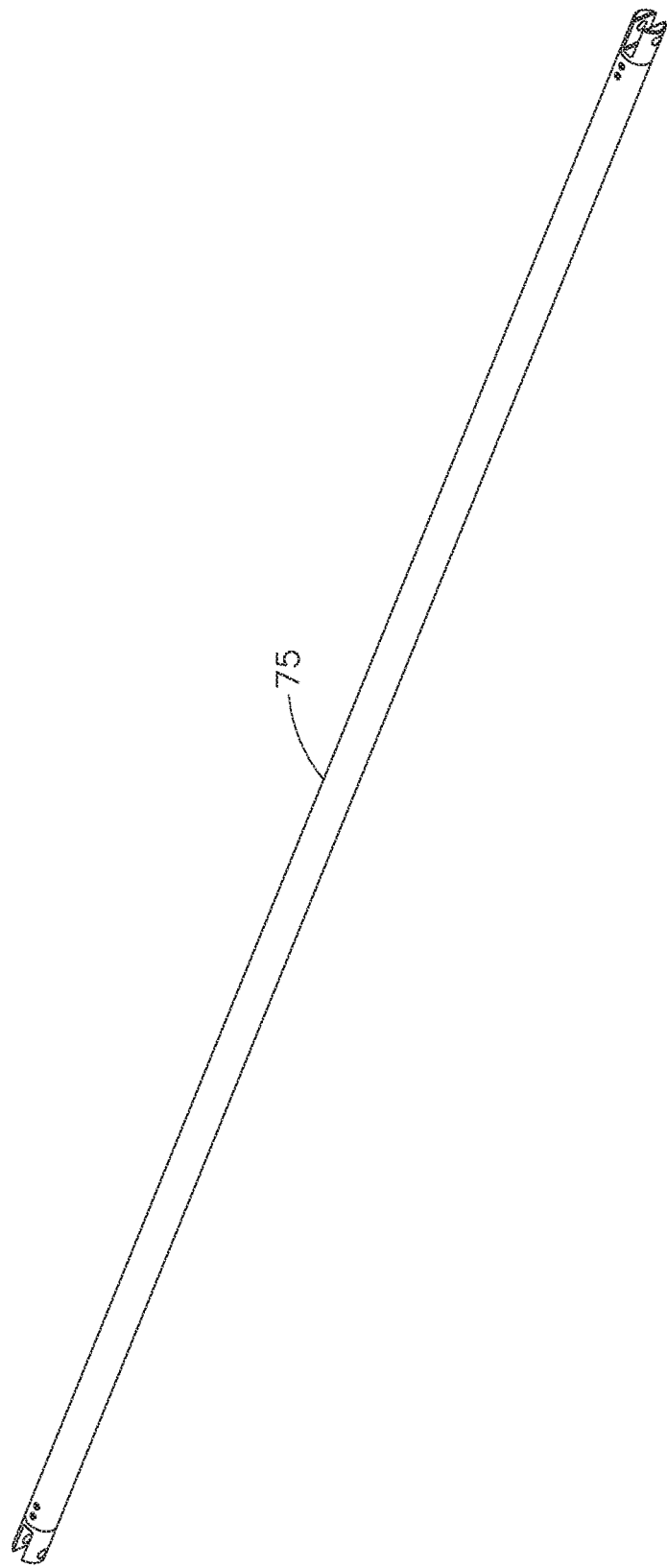
FIG. 13 shows a perspective view of an exemplary embodiment of a support member for a visual display.

As further collectively shown in FIGS. 2, 5, 6, 10-13 and 15, structure 18 includes a partial enclosure portion or partial enclosure 52 (FIG. 12) configured to receive and secure support device 14 without requiring hand tools. That is, as shown collectively in FIGS. 11 and 12, the body of support device 14 is configured and sized to be slidably received by partial enclosure 52. To simplify installation of support device 14 in partial enclosure 52, guide features 82 (FIG. 12) are formed in partial enclosure 52. Upon installation of support device 14 in partial enclosure 52, as shown in FIG. 10, a latch portion 44 of support device 14 engages a corresponding mating latch portion 48 of partial enclosure 52. Similarly, a latch portion 46 (FIG. 6) opposite latch portion 44 of support device 14 engages a corresponding mating latch portion 50 (FIG. 12). As a result of manually engaging/disengaging the corresponding mating latch portions of support device 14 and partial enclosure 52 of support structure 18, support device 14 is easily manually installed/removed from support structure 18.

For purposes of the present disclosure, as further clarified above in the context of engaging/disengaging fasteners (mating latch portions) and otherwise installing/removing the support device relative to the supporting structure, the term "without requiring hand tools" and the term "manually" or variations thereof are used interchangeably.

As further shown in FIGS. 2 and 11-13, a reinforcing member 75 is selectively securable, such as by a quick-release fastener, such as a ball-lock pin (not shown) to a corresponding reinforcing flange 53 associated with partial enclosure 52 of structure 18. As further shown in FIG. 2, reinforcing members 75 (one reinforcing member 75 shown in FIG. 2) may extend between reinforcing flanges 53 associated with partial enclosures 52, which partial enclosures 52 secure and provide structural support for support devices 14. FIG. 14 (resembling a reverse view of FIG. 2) partially shows a plurality of reinforcing members 75 positioned in a diamond shaped arrangement to provide support and rigidity to support structure 18.

As further shown in FIG. 9, display panel portion 15 includes an illumination opening portion 24' having one or more illumination sources 26, such as previously discussed. Display panel portion 15 can be secured to a corresponding display panel portion 13 using non-mechanical fasteners 74, such as magnets which additionally help align and guide the corresponding display panel portions 13, 15 together. In other words, non-mechanical fasteners 74 provide mating features between display panel portions 13, 15 that are reusable, selectably separable and self-aligning. As further shown in FIGS. 7 and 8, display panel portions 13, 15 include corresponding exterior surfaces 32, 34, in which surface 32 is substantially planar and surface 34 is faceted. In one embodiment, the exterior surfaces can both be substantially planar. In another embodiment, the exterior surfaces can both be nonplanar. In another embodiment, the opposed surfaces and/or portions of the exterior surfaces of the display panels can be shaped or behave in a visually different manner relative to the same display panel, as well as between different display panels. That is, portions of exterior surfaces, as well as entire opposed exterior surfaces of the same or different display panels can have features that involve different visual effects, such as opacity, translucence, reflection, diffusion, transparency, or a combination thereof. Diffusion is intended to include prismatic diffusion of light into the visible spectrum, as required to achieve a desirable visual effect.

Figure 15:
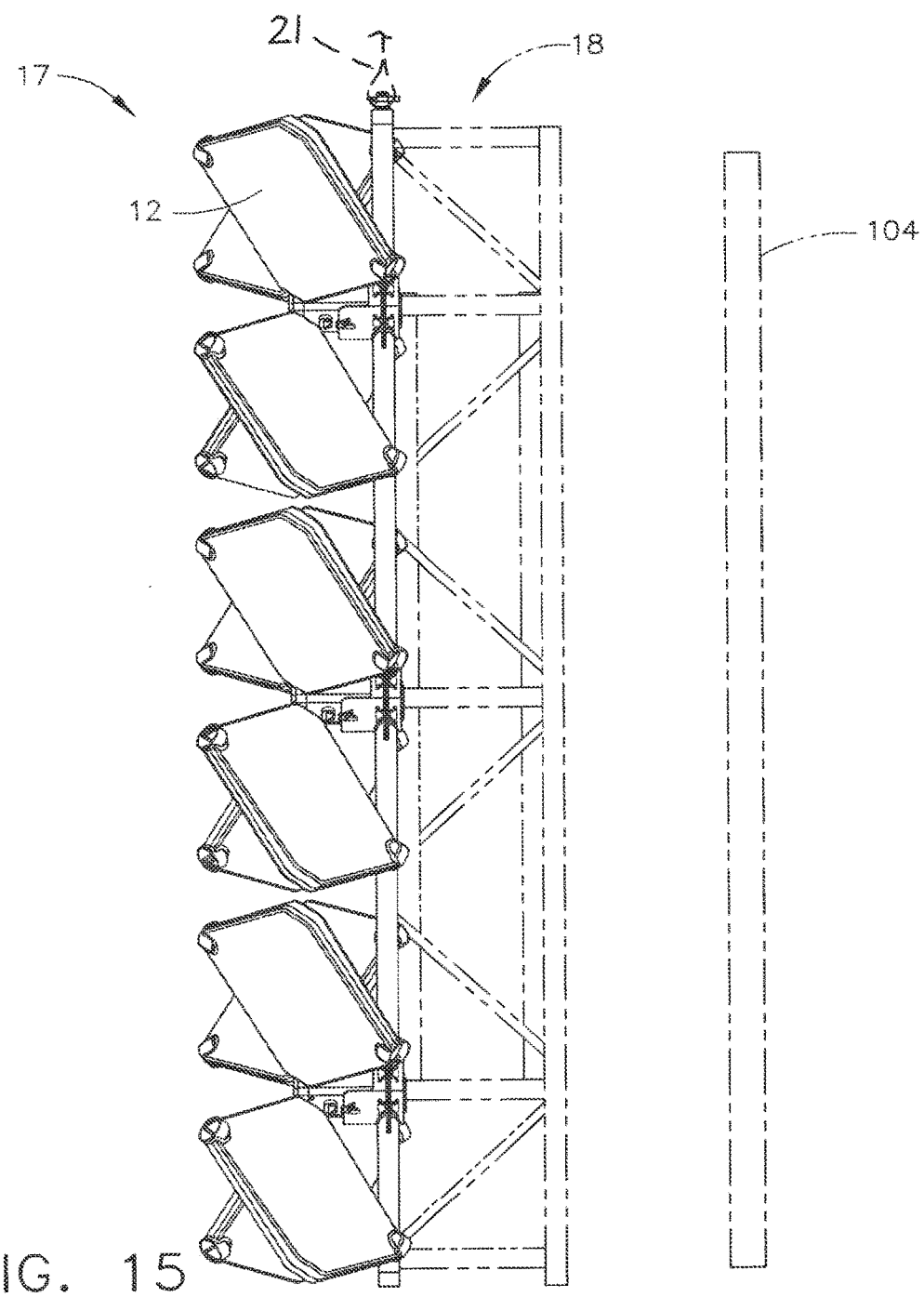
FIG. 15 shows a side view of the exemplary embodiment of the visual display of FIG. 14.

As shown collectively in FIGS. 14 and 15, visual display 10 includes a plurality of display panels 12. However, for purposes of showing an alternate embodiment (taken along line 16-16 of FIG. 14), a plurality or grouping of display panels are identified as to 12', 12", 12''' and 12'''', but are otherwise identified as display panels 12 in FIGS. 14 and 15. In addition, any combination of one or more degrees of freedom of selective movement of display panels 12, (and 12', 12", 12''', 12'''') about panel axis 22 of support device 14, such as previously discussed, is generically identified as selective movement 98. As further shown collectively in FIGS. 14 and 15, the display panels 12 are collectively arranged to resemble at least a partially discontinuous surface or second position 17 relative to at least an adjacent display panel in which each of the display panels 12 are rotated to a predetermined position about panel axis 22 relative to support device 14. As previously discussed, it is to be understood that the display panels can be moved independently relative to one another, in which movement of one display panel can selectively differ from movement of any other display panel, if desired.

The display panels 12 can be illuminated by zero illumination source(s) or more than one and/or a combination of exemplary illumination source(s) not intending to be limiting, such as emanating from inside of the display panels 12 through illumination opening(s) 24, illumination source(s) 27 exterior of the display panels 12 and positionable at any locations relative to the display panels 12, illumination source(s) 100 emanating through the exterior surface(s) 32, 34 from interior of the display panels 12, and from illumination source(s) 102 which comprise a portion of the exterior surfaces, if not one or both entire external surfaces of one or more of the panels being, for example, a low or high resolution LED panel or configured to display lighting and/or video presentations. In one embodiment, illumination source(s) 100 can emanate through openings formed in at least one of exterior surfaces 32, 34 other than illumination openings 24 or through non-opaque display panel portions 13, 15. In another embodiment, illumination source (s) 100 can be movable inside of display panels 12, such as by motors or other suitable movement device (not shown). In one embodiment, a large number of closely spaced LEDs (not shown) of illumination source(s) 102 may be included thereby creating the effect that LEDs are of high resolution. In another embodiment, the panels of illumination source(s) 102 may additionally or alternatively include Organic Light Emitting Diodes ("OLEDs") or other light sources capable of displaying images, video, or other visual displays. The panels of illumination source(s) 102 can be semi-translucent, semi-transparent, transparent, translucent, semi-opaque, opaque, or combinations thereof. In addition, LEDs of illumination source(s) 102 may be connected by electrical and/or control wires or other connectors or wireless connections. In one embodiment, panels of illumination source(s) 102 may permit high resolution including a large number of colored, closely spaced pixels permitting a clear, high resolution image, series of images, and/or video. In one embodiment, visual display 10 may be positioned in front of an LED display 104, with display panels 12 of visual display 10 selectively revealing portions of LED display 104, as desired.

In one embodiment, one or more of the illumination sources of the present disclosure can selectively change color and/or intensity, for providing desired visual effects.

Figure 16:
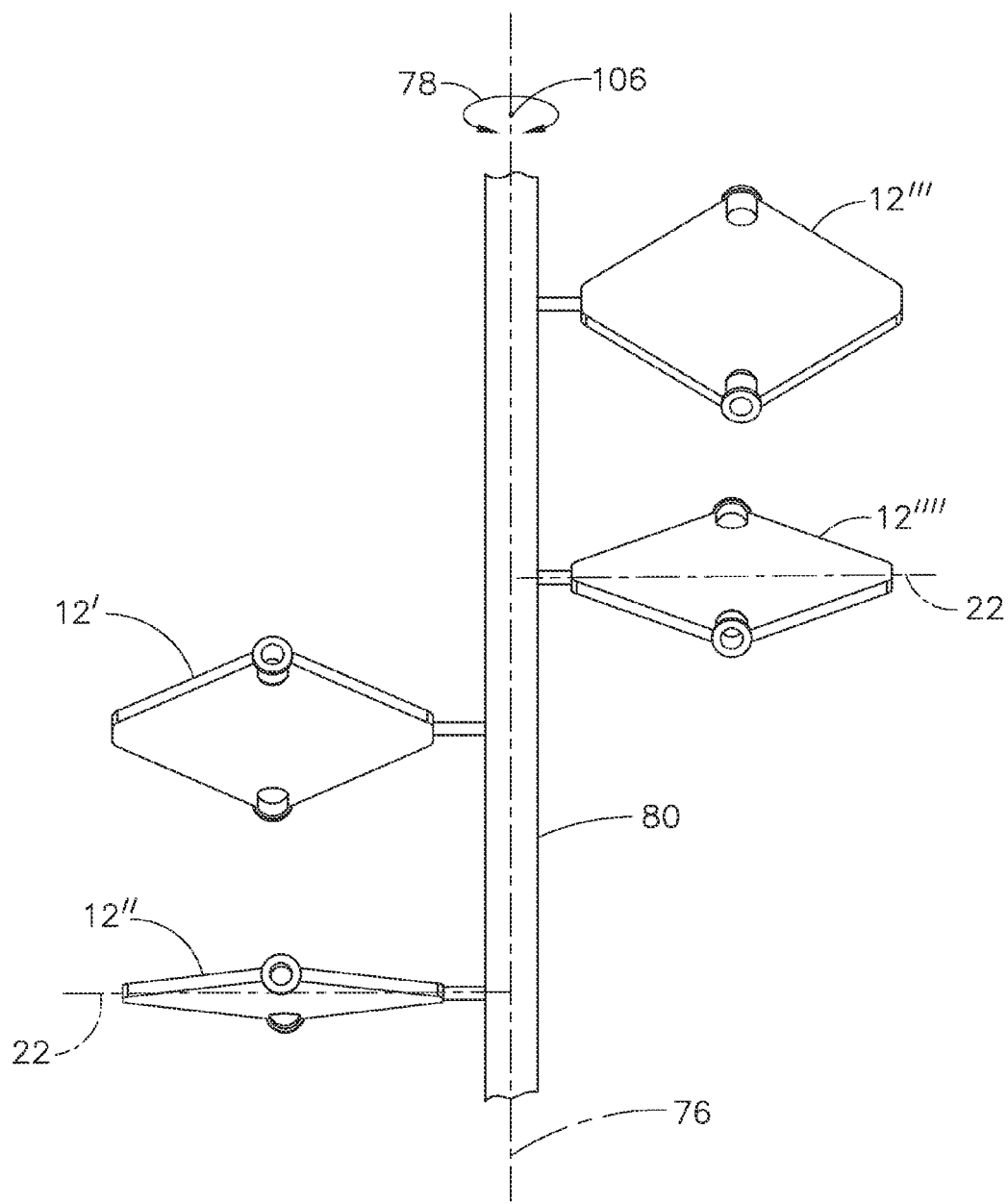
FIG. 16 shows a view taken along line 16-16 from FIG. 14 of an exemplary embodiment of a visual display.

As shown in FIG. 16, which is a view taken along line 16-16 of FIG. 14, is an alternate embodiment of the visual display. FIG. 16 shows a support device 80 having an axis 76 for collectively securing display panels 12', 12", 12''' and 12'''' about their respective panel axes 22 along axis 76. That is, as shown in FIG. 16, display panels 12', 12", 12''' and 12'''' are separated by a spacing relative to one another along axis 76, i.e., the supporting panel axes 22 are not coplanar. In one embodiment, one or more of the supporting panel axes 22 can be coplanar. As further shown in FIG. 16, support device 80 can move relative to axis 76, such as a pivoting movement 78 about a reference point 106. In another embodiment, support device 80 can generate a rotational movement about axis 76. In one embodiment, corresponding panels axes 22 of one or more of display panels 12', 12", 12''' and 12'''' can move relative to axis 76 of support device 80, including but not limited to axial movement along axis 76, rotational movement about axis 76, as well as a pivoting movement relative to axis 76, in addition to the multiple degrees of freedom of movement of one or more of display panels 12', 12", 12''' and 12'''' relative to panel axis 22, such as previously discussed.

FIG. 17 shows an alternate arrangement of a visual display 84, in which triangular shaped display panels 86 move relative to corresponding panel axes 22 of corresponding support devices 88. As further shown in FIG. 17, visual display 84 includes a combination of pluralities or groupings of display panels 86. For example, a grouping or plurality 90 of display panels 86 defines a collective hexagonal periphery along the ends of display panels 86 secured about a corresponding support device 88. Interspersed between horizontally positioned adjacent groupings or pluralities 90 of display panels 86 are groupings or pluralities 96 of display panels 86 defining a collective "bow tie" peripheral outline about corresponding support devices 88. That is, by interspersing pluralities 90 of display panels 86 and pluralities 96 of display panels 86, a continuous arrangement of display panels 86 is achieved. It is to be understood that the present disclosure includes the virtually endless possible arrangements of pluralities of display panels.

It is to be understood that display panels, such as display panels 86 can include more than one pair of opposed surfaces, such as three (defining a triangular pyramid, for example) or more surfaces, if desired, so long as relative movement of the display panels can be achieved without colliding with one another. It is also to be understood that the display panels are not required to be of the same shape and/or size, can have different numbers of opposed surfaces, textures, and visual features as desired for particular applications.

In one embodiment, the support structure 18 (FIGS. 14 and 15) can be configured to be substantially invisible, which can be beneficial if the visual display is utilized to selectably mask objects/activities positioned behind the visual display, such as an LED display. While different techniques may be employed to render support structure 18 substantially invisible, including fabricating support structure from materials that are transparent, semi-transparent or the like, in one embodiment, the support structure could at least partially comprise or primarily comprise cables 21 (FIG. 15), such as aircraft grade steel cables. In other embodiments, support structure 18 can be coated with non-reflective materials and/or of colors that could blend in with the background environment associated with the performance. If the visual display is utilized to selectably mask objects/activities positioned behind the visual display, such as an LED display, the display panels could be rotated 90 degrees relative to a first position 16 as shown in FIG. 1. For example, as shown collectively in FIGS. 14 and 15, the display panels in the second position 17 are each rotated approximately 45 degrees relative to first position 16 as shown in FIG. 1. In another embodiment, the panels can be configured to be opaque when a first exterior surface is facing an audience during a performance, while also being configured to be transparent when an opposed second exterior surface is facing the audience during the performance. In such an arrangement, the display panel surfaces would be oriented at zero degrees or 180 degrees relative to each other, depending upon the desired visual effect to be provided. One exemplary application could be for the visual display to be positioned in front of a performance stage, such as a performance stage having multiple portions. In such an arrangement, a portion of the visual display could permit selective viewing of a first portion of the performance stage while concealing a second portion of the performance stage. This arrangement could permit preparations for a subsequent scene or aspect of a performance associated with the second portion of the performance stage, while simultaneously permitting the performance occurring on the first portion of the performance stage to be viewed. In this arrangement, the length of intermissions or "down times" could be reduced or possibly eliminated.

It is to be understood that the visual display of the present disclosure can be utilized in applications involving one or more different media. For example the visual display can be used in water such as suspending at least a portion of the visual display in a pool in sufficiently close proximity to the surface of the pool such that movement of the display panels of the visual display, in combination with illumination arrangements as previously discussed, provides an intriguing visual display that includes the resulting manipulation of the texture of the surface of the water pool, including patterns and or designs formed by the display panels. In one embodiment, the visual display can include electroacoustic devices, such as audio speakers, positioned in or on any portion of the visual display components, including structure, which electroacoustic devices capable of producing audio or visual effects, such as ripples in the water or surrounding media. In another embodiment, the visual display can include bubble-making apparatus for providing visual effects. Similarly, the display panels may be used in combination with a falling water layer flowing over or behind the display panels, or arranged for use with smoke/fog, including but not limited to fog created by carbon dioxide sublimation alone or in combination with illumination arrangements as previously discussed. That is, by virtue of the visual effects desired as well as the environment or surrounding media, the display panel may be used in a multitude of orientations and illumination arrangements.

For example, in another application, the display panel may be used with one or more lasers/reflectors as part of a visual performance, including but not limited to patterns, text, and pictorial displays.

In another embodiment, the visual display, in and of itself, may not be directly visible by an audience viewing a performance, but nonetheless can contribute greatly to the visual performance. For example, a visual display can be positioned substantially horizontally, such as behind a raised curtain such that the visual display itself may not be directly viewable by an audience. However, the visual display could be utilized to interact with illumination arrangements either suspended or positioned along the floor or other position in the performance venue, to provide lighting for other objects and/or actors associated with the performance.

It is to be understood that the embodiments and features disclosed herewith may be utilized in any combination or media to provide intriguing, entertaining visual effects, and are contemplated by the present disclosure.

While the disclosure has been described with reference to a preferred embodiment, it will be understood by those skilled in the art that various changes may be made and equivalents may be substituted for elements thereof without departing from the scope of the disclosure. In addition, many modifications may be made to adapt a particular situation or material to the teachings of the disclosure without departing from the essential scope thereof. Therefore, it is intended that the disclosure not be limited to the particular embodiment disclosed as the best mode contemplated for carrying out this disclosure, but that the disclosure will include all embodiments falling within the scope of the appended claims.

What is claimed is:

1. A visual display device comprising:
a plurality of display panels forming a display area, each of the display panels is securable to a common support device and independently movable relative to a nonmovable axis associated with the common support device, the common support device nonmovably positioned within the display area, the display panels positionable in a first position, comprising a first display panel movable relative to a nonmovable first axis and a second display panel movable relative to a nonmovable second axis, the first axis and the second axis being nonparallel to each other, wherein the first display panel and the second display panel are capable of simultaneous movement.

2. The visual display device of claim 1, wherein the first position of the display panels provides an appearance of a substantially continuous surface relative to an adjacent display panel.

3. The visual display device of claim 2, wherein the substantially continuous surface is substantially planar.

4. The visual display device of claim 1, wherein each of the display panels is independently rotatable relative to an axis associated with the common support device.

5. The visual display device of claim 1, wherein at least one of the display panels is independently pivotably movable relative to an axis associated with the common support device.

6. The visual display device of claim 1, wherein each axis radially extending outward from the common support device.

7. The visual display device of claim 1, wherein at least a portion of an external surface of at least one display panel includes a first surface feature on the exterior surface providing a visual effect different than a visual effect provided by a second surface feature on the external surface of a remaining portion of the at least one display panel.

8. The visual display device of claim 1, wherein at least one display panel having an illumination source providing illumination from interior of the display panel.

9. The visual display device of claim 8, wherein at least one illumination source is movable relative to the display panel.

10. The visual display device of claim 8, wherein at least a portion of one display panel is a high resolution panel.

11. The visual display device of claim 1, wherein illumination is provided from at least one source external of the display panels.

12. The visual display device of claim 8, wherein illumination is provided from at least one source external of the display panels.

13. The visual display device of claim 1, wherein a support structure selectively receives and secures the common support device without requiring hand tools.

14. The visual display device of claim 13, wherein the support structure includes guide features for receiving the common support device.

15. The visual display device of claim 13, wherein the support structure is substantially invisible.

16. The visual display device of claim 15, wherein the structure is at least partially comprised of cable.

17. The visual display device of claim 7, wherein at least one of the first surface feature and the second surface feature involves opacity, translucence, reflection, diffusion, transparency, or a combination thereof.

18. A visual display panel comprising:
a first display panel movable relative to a first axis for interacting with a second display panel movable relative to a second axis, the first display panel and the second display panel forming a display area, the first display panel and the second display panel directly securable to a common support device nonmovably positioned within the display area and independently movable relative to the first axis and the second axis, the first axis and the second axis being non-parallel to each other and being nonmovable relative to the common support device, wherein the first display panel and the second display panel are capable of simultaneous movement;

the first visual display panel comprising a body securable to a support device along an axis of the support device, the body movable relative to the axis, the body having a first portion and a second portion including non-mechanical selectively separable, reusable, self-aligning mating features.

19. The visual display panel of claim 18, wherein the mating features include magnets positioned in the first portion and the second portion.

20. A method for forming a visual effect, comprising:
providing a plurality of display panels, each of the display panels is directly secured to a nonmovable common support device and independently movable relative to a nonmovable axis associated with the common support device, the display panels positionable in a first position, comprising a first display panel movable relative to a nonmovable first axis and a second display panel movable relative to a nonmovable second axis, the first axis and the second axis being nonparallel to each other, wherein the first display panel and the second display panel are capable of simultaneous movement; and providing a plurality of display panels forming a display area, each of the display panels having a motor within the display area for moving the display panels relative to one another; and actuating the motor of at least one of the display panels between a first position and a second position.

21. A visual display comprising:
a plurality of visual display devices to form the visual display, the visual display having a display area, the visual display devices each comprising:
a plurality of display panels, each of the display panels is securable to a common support device and independently movable relative to a nonmovable axis associated with the common support device, the common support device nonmovably positioned within the display area, the display panels positionable in a first position, comprising a first display panel movable relative to a nonmovable first axis and a second display panel movable relative to a nonmovable second axis, the first axis and the second axis being nonparallel to each other, wherein the first display panel and the second display panel are capable of simultaneous movement.

* * * * *